US006886152B1

(12) United States Patent
Kong

(10) Patent No.: US 6,886,152 B1
(45) Date of Patent: Apr. 26, 2005

(54) DELAY OPTIMIZATION IN SIGNAL ROUTING

(75) Inventor: Raymond Kong, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/215,951

(22) Filed: Aug. 9, 2002

(51) Int. Cl.$^7$ ............................................. G06F 17/50
(52) U.S. Cl. ............................ 716/16; 716/18; 716/6
(58) Field of Search .......................... 716/16, 18, 6, 716/2–5, 17

(56) References Cited

U.S. PATENT DOCUMENTS

| | | | | | |
|---|---|---|---|---|---|
| 5,452,239 | A | * | 9/1995 | Dai et al. ...................... | 703/19 |
| 5,521,837 | A | | 5/1996 | Frankle et al. | |
| 5,956,256 | A | * | 9/1999 | Rezek et al. .................... | 716/3 |
| 6,009,248 | A | * | 12/1999 | Sato et al. ...................... | 716/2 |
| 6,014,507 | A | * | 1/2000 | Fujii ............................ | 716/12 |
| 6,051,031 | A | * | 4/2000 | Shubat et al. ................... | 716/3 |
| 6,269,468 | B1 | * | 7/2001 | Dean et al. ..................... | 716/2 |
| 6,324,671 | B1 | * | 11/2001 | Ratzel et al. ................... | 716/1 |
| 6,374,393 | B1 | * | 4/2002 | Hirairi .......................... | 716/8 |
| 6,462,579 | B1 | * | 10/2002 | Camilleri et al. ............... | 326/41 |
| 6,496,970 | B1 | * | 12/2002 | Kong et al. .................... | 716/13 |
| 6,501,297 | B1 | * | 12/2002 | Kong ........................... | 326/41 |
| 6,507,807 | B1 | * | 1/2003 | McBride ....................... | 703/14 |
| 6,525,561 | B2 | * | 2/2003 | Cline ........................... | 326/39 |
| 6,711,720 | B2 | * | 3/2004 | Chen ............................ | 716/2 |
| 6,735,555 | B1 | * | 5/2004 | Suzuki et al. ................... | 703/2 |
| 2002/0145444 | A1 | * | 10/2002 | Mizuno et al. ................. | 326/41 |
| 2003/0088835 | A1 | * | 5/2003 | Lindkvist et al. ............... | 716/2 |
| 2003/0177453 | A1 | * | 9/2003 | Chen ............................ | 716/2 |

OTHER PUBLICATIONS

Wang et al., "Analysis and design of high–speed and low–power CMOS PLAs", IEEE Journal of Solid–State Circuits, vol. 36, No. 8, Aug. 2001, pp. 1250–1262.*
R. B. Hitchcock, Sr., G. L. Smith, D. D. Cheng, "Timing Analysis of Computer Hardware," Jan. 1982, pp. 100–105, vol. 26, No. 1, IBM J. Res. Develop.
Paul Penfield and Jorge Rubenstein, "Signal Delay in RC Tree Networks," 18th Design Automation Conference, Jun. 1981, pp. 613–617.
W. C. Elmore, "The Transient Response of Damped Linear Networks with Particular Regard to Wideband Amplifiers," Journal of Applied Physics, Jan. 1948, pp. 55–63, vol. 19, No. 1.

* cited by examiner

Primary Examiner—Matthew Smith
Assistant Examiner—Phallaka Kik
(74) Attorney, Agent, or Firm—Lorraine S. Hirsch; Edel M. Young; Justin Liu

(57) ABSTRACT

A delay optimization algorithm has four major steps: (1) selecting signal connections to target for delay improvement; (2) unrouting all signals containing those candidate connections; (3) rerouting those signals, using a "load-balancing"heuristic; and (4) during rip-up and re-try routing, protecting wiring to all signal loads routed by the heuristic, including non-timing critical loads. Load balancing includes (a) applying a branching penalty on logic cell output wire segments, and (b) encouraging all non-route critical loads to route through a single buffered wire segment.

23 Claims, 7 Drawing Sheets

DELAY OPTIMIZATION IN SIGNAL ROUTING

FIELD OF THE INVENTION

The present invention relates to field programmable gate arrays (FPGAs), and in particular to routing a design so that delays are reduced to meet specified timing requirements.

BACKGROUND OF THE INVENTION

Programmable logic devices are available for implementing any of a wide variety of logic designs. The user designs a logic circuit, and uses software to direct a computer to program a logic device to implement the design. Timing of signals passed between parts of the logic device depends in part upon placement of the user's circuit elements into transistor groups in the physical structure and the resultant arrangement of the metal wires. In general, longer wires mean longer delays, the actual timing depending upon capacitances, resistances, and the number of logic elements a signal must traverse. As transistors have become faster, a larger percentage of the delay in passing a signal through the device is contributed by the wiring. Therefore it has become a worthwhile effort to select wiring segments carefully to minimize the delay caused by these wiring segments.

FPGA devices include a plurality of configurable logic blocks or modules connected together by programmable interconnect lines. The configurable logic blocks can be programmed to implement multiple functions, and the programmable interconnect can be connected together in a wide variety of ways to produce an overall structure which implements the user's design.

In a typical island-type FPGA, a plurality of configurable logic blocks (CLBs) implement functions selected by a user, and must be interconnected to perform an overall function desired by the user. Wire segments are provided in the chip for interconnecting these CLBs. The CLB leads (wires extending from CLBs) may be programmably connected to the wire segments, for example by pass transistors at programmable interconnect points (PIPs).

Also present in the FPGA are switch boxes that selectively interconnect the wire segments to each other at PIPs. These PIPs may offer a variety of connections, for example simple pass transistors, transmission gates, unidirectional buffers, and bidirectional buffers.

Wire segments of different lengths extend between pairs of switch boxes. Longer segments are useful for high fanout signals, or to route signals whose components are placed relatively far apart, while shorter segments are best for local routing. The time delay experienced by a signal routed from one CLB to another will depend upon the kinds of wire segments used and the kind and number of PIPs traversed.

Definitions

In a logic design, a conductive route from one source logic block or register to one destination logic block or register is called a connection. Frequently a signal generated at one source must be sent to several destinations (also referred to as "loads" or "sinks"). The collection of routes from one source to all destinations is called a net. In the hardware which implements the logic design, a single piece of wire which makes up one part of a connection or net is called a segment. One segment can be interconnected to another at a PIP. Typically, a wire segment may be interconnected to any of several other wire segments at a PIP. A path is the set of connections and combinational logic blocks that extend from one package pin or clocked register to another package pin or clocked register.

Motivation to Include Interconnect Wiring in Timing Analysis

If segments are connected at PIPs by turning on transistors, the connection will comprise both wire segments and transistors. Since transistors still have finite resistance in their ON states, the connection will impose a finite RC delay on the signal path. Further, as feature size decreases, the fraction of delay due to wiring increases. Connection delays have become a significant part of the total delay for transistor-connected devices. Even for hard-wired ASIC devices, as feature size has become smaller, wiring has begun to contribute a major part to total delay of signals. In devices such as FPGAs, a variety of routing resources have a variety of time delay characteristics. Therefore routing can significantly affect timing of the configured logic device.

The task of FPGA routing is to select interconnect lines to realize connections in the user's design that join partitioned pieces of the user's logic. In general, a route to connect a source logic block to a destination logic block is selected by adding segments one step at a time to form a continuous connection between source and destination.

Search Algorithms to Establish Connections

The generic routing problem is well studied. The most common search algorithms are based on breadth-first expansion searches, biased so that segments more likely to be useful are explored earlier. Such algorithms will find a path if one exists. The search process is typically repeated for each connection in turn. As later connections are routed, there are fewer free routing resources. It becomes difficult to complete later connections legally, e.g., without crossing other signals. When legal routes cannot be found, the router can either leave affected connections unrouted ("opens") or temporarily allow them to overlap other signals ("shorts"). Later connections tend to become longer and less efficient, or produce more shorts that must be removed by rerouting. The collective result of finding connections will in general depend on which connections are routed first as well as on the algorithm used to route each connection.

A connection can be routed using different goals. In resource-based routing, the focus is on completing the connection with minimum total cost of the resources consumed, where each segment and PIP is assigned a cost depending, e.g., on its reach and the scarcity of that type of resource.

In delay based routing, the goal is to find a route for which the connection delay is less than a target determined to support the overall (path) timing constraints of the design.

Register-to-Register Transfers

A typical logic design uses both clocked registers (flip-flops) and un-clocked combinational and arithmetic functions. Timing of the overall device (how fast the device can be clocked) is determined by how quickly a signal can propagate from the output of one clocked register to the input of the next clocked register. This in turn depends upon how quickly any intermediate logic can be processed, and on delays in wire segments and PIPs that connect the combinational logic blocks along the path.

Improving the Device Performance—Critical Paths

The time delay for each path used can be computed once routes have been selected. Users are generally interested in minimizing the longest delay in propagating a signal between one clocked register and another because this delay determines the maximum clock speed which can be used with the device when it is implementing the user's function. The slowest or "critical" path limits the speed of the device. Critical path delay must be reduced if the overall speed of the device is to be improved. The task of transforming the results of critical path analysis into guidance for routing is not trivial.

Slack

When a timing requirement in one connection of a logic design fails to be met but a timing requirement in another connection of the logic design is met with time to spare, it may be possible to adjust element routes so that timing of the connection with room to spare is made slower while speeding up the connection that failed to meet a requirement so that all paths meet the requirements. The room to spare is called slack. The slack of a path is defined as R(p)−A(p) where R(p) is the required propagation time along path p, and A(p) is the actual total propagation time along path p. Positive slack indicates a connection with time to spare. Negative slack indicates that a timing requirement has been missed. Near-zero (positive) slack means a timing requirement is barely met. Paths routed with positive slack can be rerouted to have less positive slack if that action allows other paths with negative slack to be rerouted so that they meet a timing requirement.

Slack Calculation for Connections of a Path

In a typical circuit, there will be both fan-in (multiple signals entering an element) and fanout (output signals applied to more than one element). The slack of a connection, slack(c), is defined as the minimum slack of any path that includes c. Equivalently, $$\text{slack}(c) = R(c) - A(c) \quad (1)$$

where:

R(c) is the earliest required arrival time of a signal at the output end of connection c, and A(c) is the latest actual arrival time of a signal at the output end of connection c.

R. B. Hitchcock, Sr., G. L. Smith, and D. D. Cheng, in "Timing Analysis of Computer Hardware,", IBM J. Res. Develop., Vol. 26, No. 1, pp. 100–108, 1982, described how to compute slacks of all connections in a design. Two linear time computations suffice—forward propagation of actual times, and backward propagation of required times.

Routing delay from a net's source S to a load L is a function of the topology of the routing to all loads of the net, not just the segments along the route from S to L. This effect can be approximated by expressions described by Penfield and Rubenstein (Penfield, Paul Jr. and Rubenstein, Jorge, *"Signal Delay in RC Tree Networks"*, Proceedings 18th Design Automation Conference, 613-617, June 1981), extending the early analysis presented by W. C. Elmore, *"The Transient Response of Damped Linear Networks with Particular Regard to Wideband Amplifiers"*, Journal of Applied Physics, vol. 19, no. 1, pp. 55–63, January 1948. The approximate delay from source S to load Lj is $$T(S, Lj) = \Sigma k \, Rk * Cap(k)$$

Where the summation is over all wire segments k on the route from S to Lj, Rk=resistance of a wire segment k and Cap(k)=total capacitance in the downstream sub-tree rooted at k, i.e., on the other side of k from the source S.

The relevance of this formula to the routing of multi-load nets can be seen by studying the change in delay at a given load (Lj) that results from completing an additional route from the same source (S) to a different load (Ln) that branches off from the original route at a node B.

FIG. 1a shows an RC network 100 of the background art representing a routed connection S to Lj. The routed delay from S to Lj can be defined as Dj.

FIG. 1b shows the same RC network from S to Lj with a new routed branch 110 from node B to Ln. In the example shown in FIG. 1b, the routing to Ln causes extra delay to occur on the existing route to Lj. The added delay is caused by the additional parallel capacitance (between B and Ln) loading the upstream resistance between S and B. The new delay at Li is given by the following equation:

$$Dj(\text{new}) = Dj(\text{old}) + \Sigma k (Rs * Ck)$$

where the summation is over segments k on the new branch from B to Ln, Rs is the upstream resistance common to the paths from S to Lj and from S to Ln. In this case, RS=R1+R2+R3 and Ck includes C4, C5, C6.

Previous approaches to routing used two main techniques to reduce connection delays: early branching and preservation of critical load routing. In "early branching", after a first load has been routed, delay-based routes are encouraged to pick branch points close to the signal driver. Although this reduces the upstream resistance that contributes to later loads (and hence helps keep delay small), it does not eliminate the secondary effect on critical loads of capacitance on side routes past the branch point, termed "parallel capacitance".

Second, routes to critical loads are preserved during rip-up and retry phases. This optimization does not exploit the possible advantage in control of parallel capacitance from preserving well-chosen routes to non-critical loads.

What is needed is a new delay-driven routing method that is less vulnerable to increases in delay due to uncontrolled increases in capacitance on routing branches parallel to critical routes.

SUMMARY OF THE INVENTION

The present delay optimization algorithm has four major steps: (1) selecting signal connections to target for delay improvement; (2) unrouting all signals containing those candidate connections; (3) rerouting those signals using a "load-balancing" heuristic; and (4) during rip-up and re-try routing, protecting wiring to all signal loads routed by the heuristic, including non-timing-critical loads.

First, before engaging in delay-based routing optimization, the proposed algorithm selects those signal connections to which delay improvement efforts will be applied.

The criteria used may be varied in order to achieve the desired effects. In one embodiment, all signal connections with timing constraints are selected as candidates. This approach typically yields the best improvements for all signal delays. However, if run time is a consideration, it may be desirable to limit the number of candidates. In another embodiment, only connections with negative slack (or slack less than a specified threshold) are considered. This approach offers a good trade-off between run time and quality.

The new heuristic seeks to improve the selected connections. Improvements made on these signal connections contribute directly to the speed-up of the circuit's critical paths and have the potential to increase its operating frequency.

Second, the router un-routes all signals that contain those candidate signal connections.

Third, the router applies a new delay optimization technique, referred to as load balancing, to reduce the delays of the selected signal connections. The details of load balancing are given in a later section.

Lastly, if the load balancing algorithm produces a better result, then routes to all loads routed by the algorithm are preserved and protected during the router's rip-up and retry phase. Only if design routability is in question, is the router then allowed to alter the routing of these connections. Potential routability problems can be detected by failure of rip-up and re-try iterations to reduce the number of un-routed signal connections. In that event, the router then takes the serious measure of allowing load-balanced loads to be ripped up and rerouted.

The load-balancing algorithm is a key ingredient in improving signal delays. This algorithm is intended to minimize the addition of parallel capacitance and concomitant net delay to existing loads of a signal.

The first step of the load-balancing algorithm is to apply a branching penalty on all logic cell output wire segments. This tends to reduce the impact on critical loads from side branches in which a PIP must drive many wire segments s with high capacitance.

The second step of the load-balancing algorithm is to identify a single buffered PIP, and encourage all non-critical loads to route through this PIP. One method to find such a PIP is to select the first buffered PIP downstream from an output multiplex, i.e., an OMUX (large buffer) PIP, along the route to the load with the greatest slack, and attempt to re-route the non-critical loads through this PIP.

After the router completes the load balancing algorithm, the router attempts to preserve the delay improvements by protecting results just generated. The router identifies all routing resources committed during load balancing optimization and makes it expensive for them to be ripped up. This heuristic preserves routing not only to timing-critical loads but also to the non-critical loads. The rip-up and retry phase attempts to preserve and leave the entire signal intact; preserving the topology helps to preserve improved connection delays.

DETAILED DESCRIPTION OF THE PREFERRED EMBODIMENTS

Figure 1A:
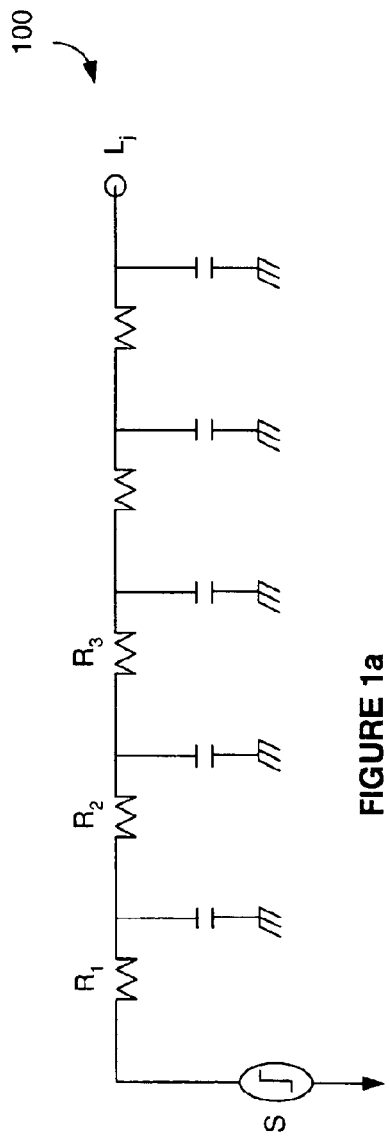
FIG. 1a is a depiction of an RC network of the background art representing a routed connection from source S to load Lj.
Figure 1B:
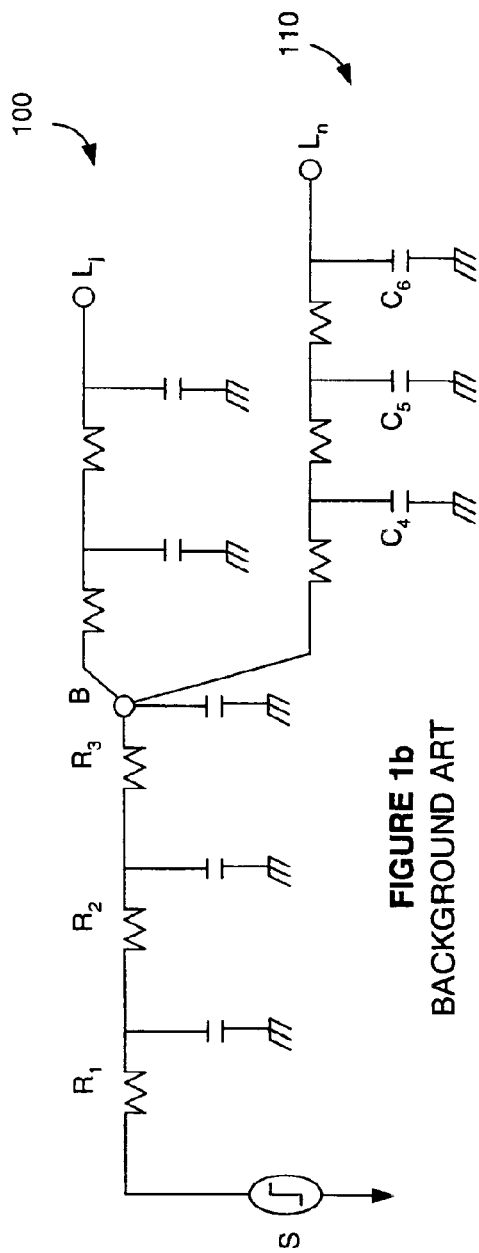
FIG. 1b shows the network of FIG. 1a, with a new routed branch to Ln from node B.
Figure 2:
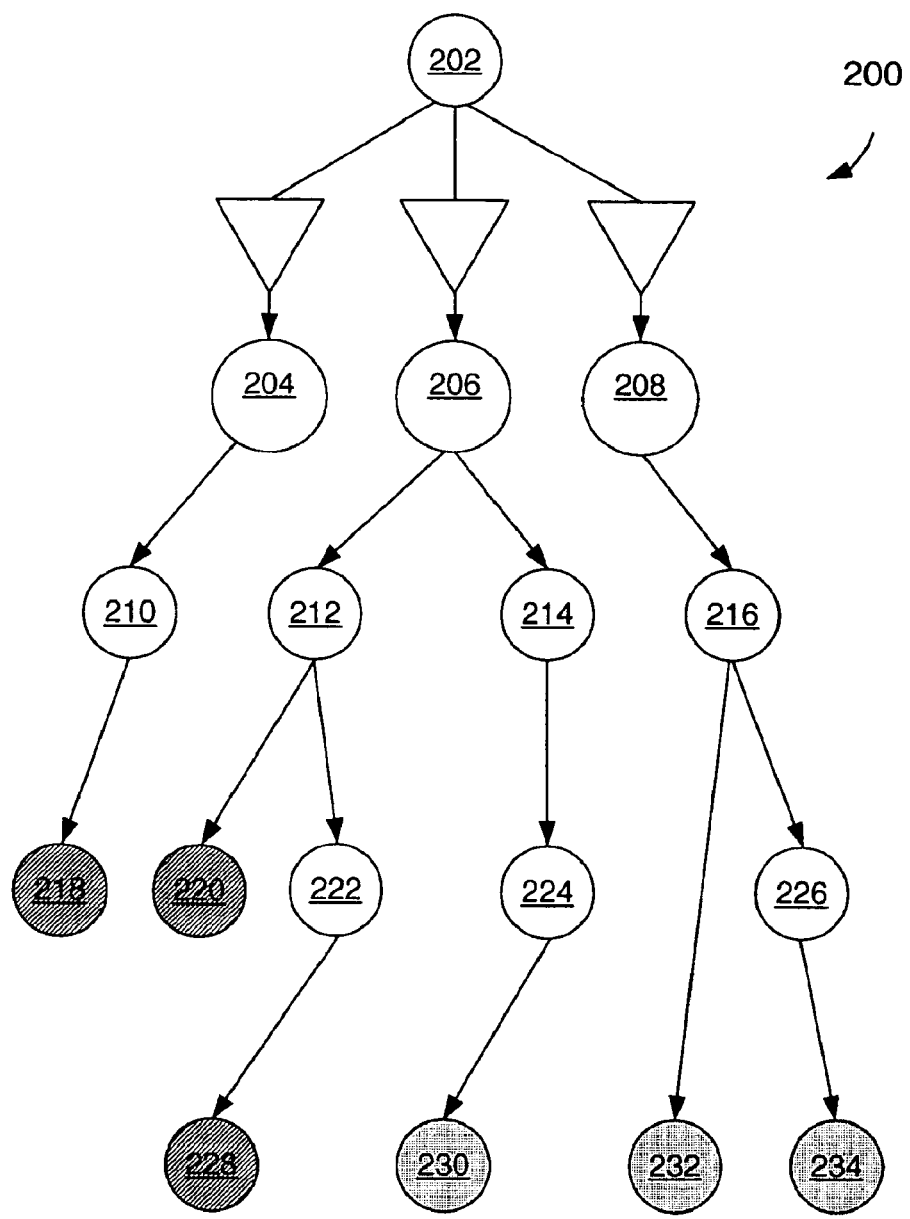
FIG. 2 is a schematic illustration of a routing solution of the prior art.

FIG. 2 schematically illustrates a routing solution 200 of the prior art. The routing solution is represented by a directed graph such that each node (circle) in the graph represents an electrically equivalent wire segment and each arc (line or line plus buffer) in the graph corresponds to a PIP. The arc direction corresponds to the direction of current flow. As shown in FIG. 2, both timing-critical loads, schematically represented by nodes 218, 220, and 228; and non-critical loads, schematically represented by nodes 230, 232, and 234, are routed through large buffered nodes 204, 206, and 208, and intermediate nodes 210, 212, 214, 216, 222, 224, and 226. Routing signals through large buffered nodes exposes the driver to multiple large capacitances, resulting in severe delay.

Figure 3:
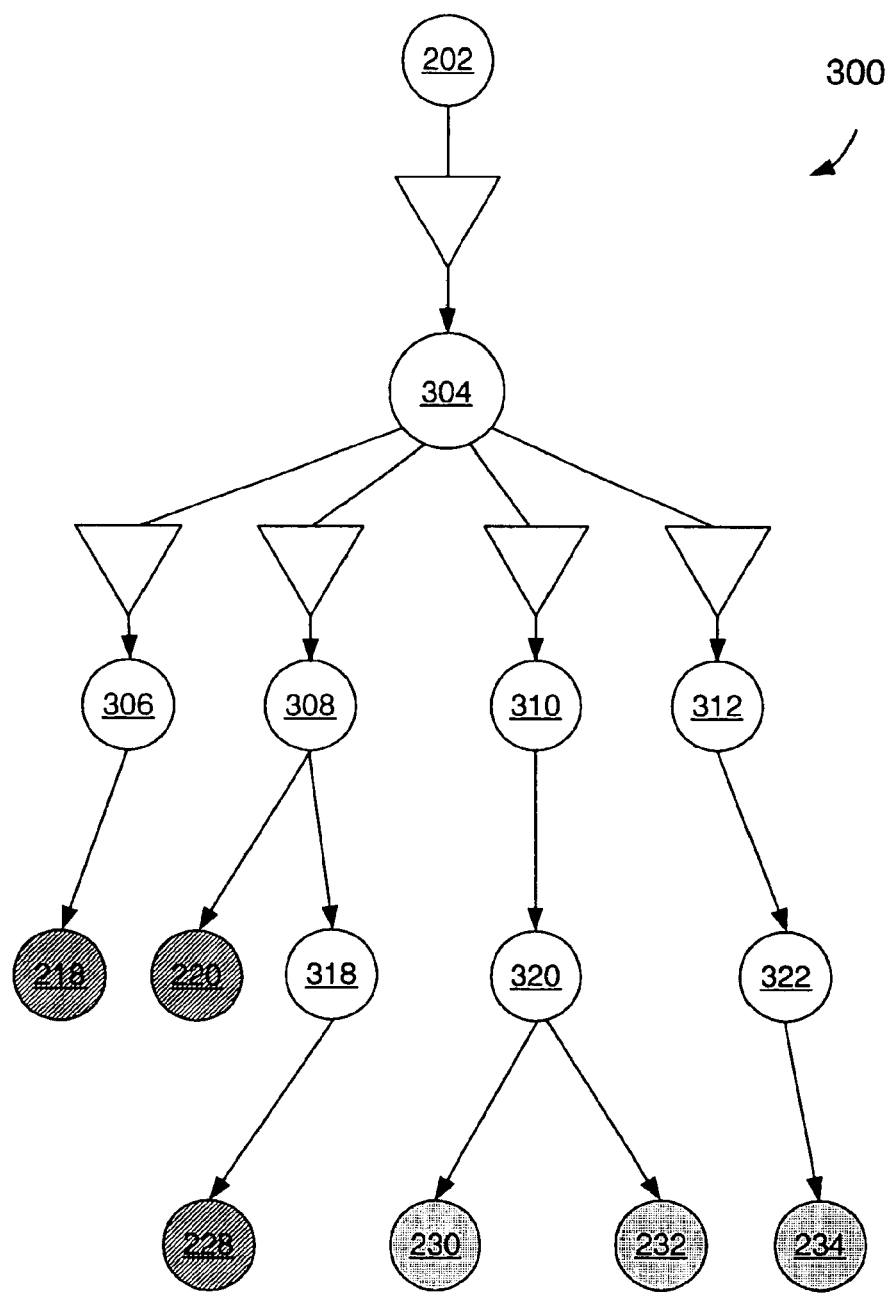
FIG. 3 is a schematic illustration of a routing solution in which a branching penalty in accordance with the present invention is applied.
Figure 4:
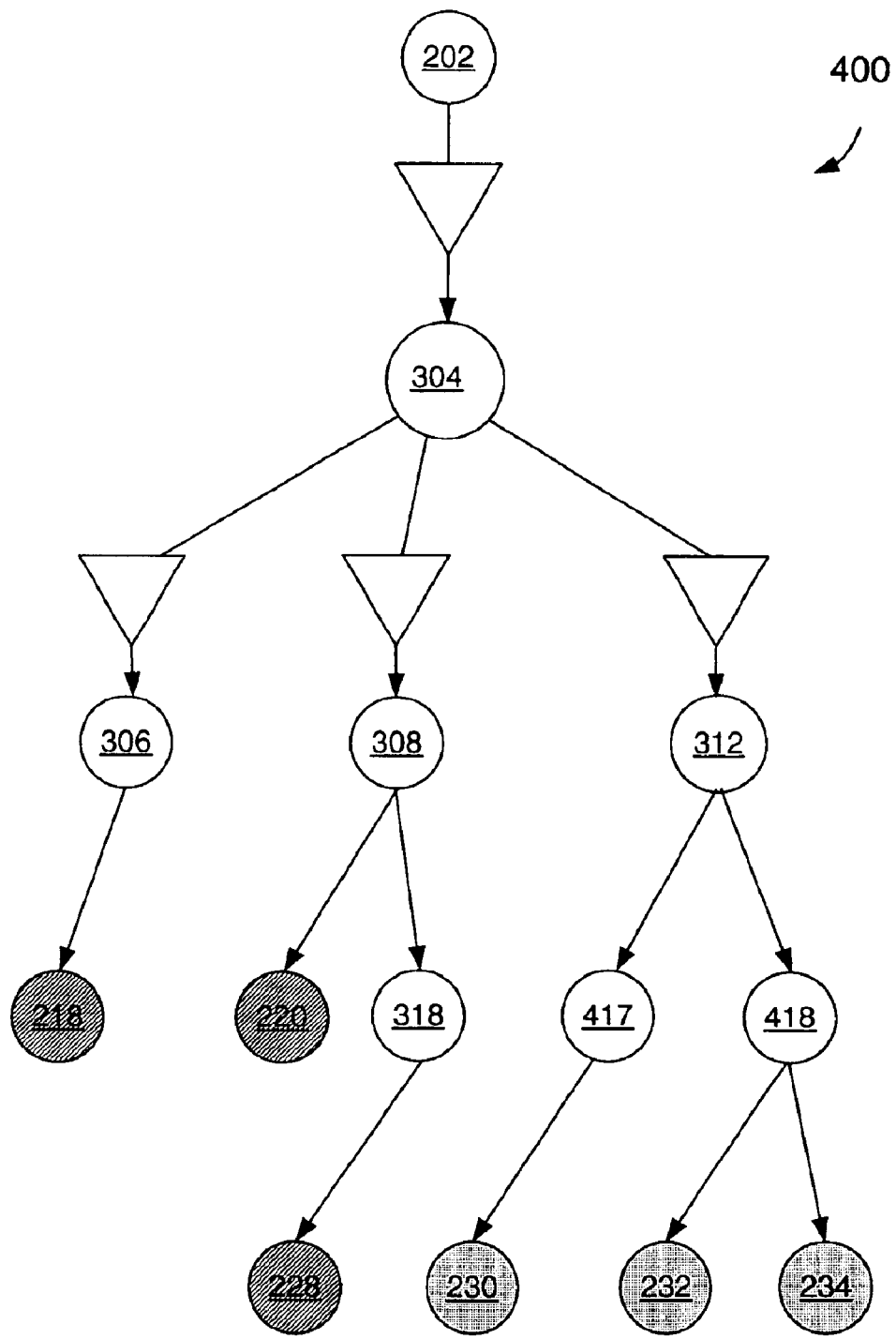
FIG. 4 is a schematic illustration of a routing solution in which a load balancing heuristic in accordance with the present invention is applied.

FIG. 3 and FIG. 4 illustrate the sequential application of a branching penalty and a load balancing heuristic to the signal of FIG. 2.

The use of buffered nodes involves a tradeoff. A large input capacitance is incurred; but the subtree driven by the buffer, considered as a side branch, contributes delay only according to its input capacitance. The buffer has the effect of hiding all downstream wire and device capacitances in its sub-tree from the rest of the signal. The load-balancing heuristic exploits this property.

FIG. 3 schematically illustrates a routing solution 300 of the present invention. As illustrated in FIG. 3, the router reroutes the set of candidate signals by applying a branching penalty on the logic cell output wire segment 202 (the source).

In essence, the router is discouraging any multiple segment fan-outs from the output wire segment, thus significantly reducing the exposure of the output wire segment to large input capacitances. The result is that the signal is routed out from wire segment 202 through only one large buffered wire segment, wire segment 304. The signal is routed through intermediate wire segments 306, 308, 310, 312, 318, 320, and 322 to connect to both critical loads 218, 220, and 228, and non-critical loads 230, 232, and 234.

After those signal loads have been rerouted using the branching penalty, the router can further optimize and reduce the parallel capacitances for critical loads.

FIG. 4 illustrates the results of applying a load balancing heuristic to solution 300. The router performs a load balancing step, rerouting non-timing-critical loads 230 and 232 through a single buffered wire segment, wire segment 312, shielding additional parallel capacitances from critical loads 218, 220, and 228.

The router begins this phase by identifying non-timing critical loads to be routed through a common buffer. The criteria used may differ in practice. In one embodiment, the router selects those loads that are not on any critical paths, i.e., have a connection slack greater than a predetermined threshold. After the set of non-critical loads is selected, the router locates a single buffered wire segment, referred to as a balance node, that all non-critical loads are encouraged to route through. The technique used to select a balance node may vary in practice.

In one embodiment, the router examines the list of non-critical loads and determines the load with the largest slack. Here; suppose that is load 234. From that load, the routing trace to the driver is searched. A reasonable balance node is a buffered wire segment downstream from and close to a large buffer wire segment. Here, suppose this balance node is wire segment 312. After a balance node has been located, the router rips up routing to all non-critical loads (here, 230, 232) that are not routed through the balance node and tries to reroute through the balance node. In one embodiment, the router achieves this desired effect by applying additional branching penalties to all wire segments on route to the critical loads (i.e., 202, 304, 306, 308, 218, 220, 318, and 228). In effect, the router makes the balance node the most attractive option to complete the routes for the remaining non-critical loads.

In practice, the load-balancing algorithm is flexible and can be applied in various scenarios. As mentioned previously, the load-balancing algorithm can be applied during the normal course of routing, e.g., during delay-based routing to all connections on timing-constrained paths. This application typically yields the best signal delays. However, if run time is a consideration, this algorithm can be applied as a separate delay optimization phase. For example, the load-balancing algorithm can be applied after a feasible routing solution has been found. This application brings a good trade-off between run-time and quality, since the algorithm focuses only on those signals with connections that are on critical paths. Any improvements made to these signal delays can contribute directly to a design's overall frequency.

Figure 5:
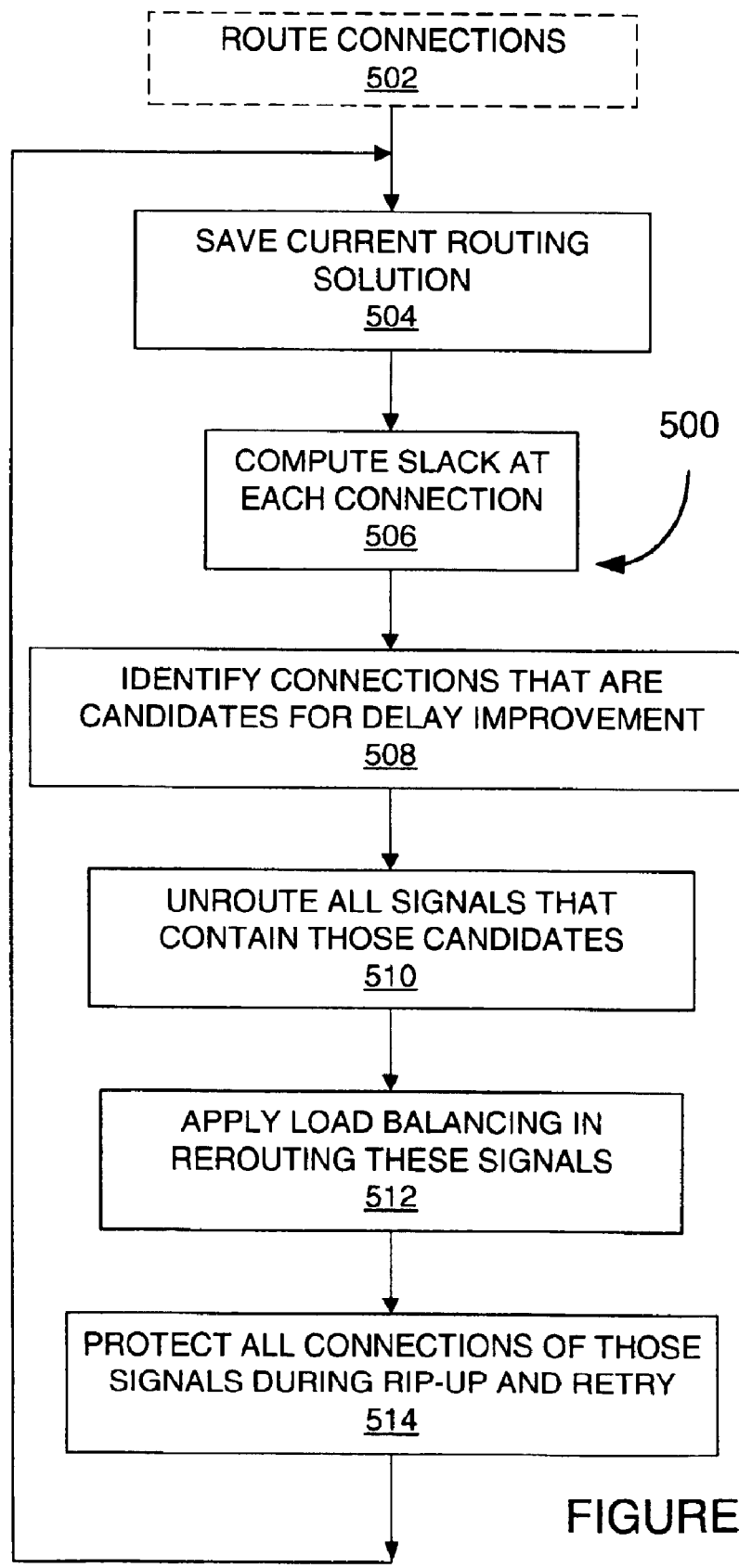
FIG. 5 is a flow chart of a method in accordance with an overview of the invention.

FIG. 5 illustrates a method 500 of the invention. At step 502, an initial set of routes is established. The set can be a preliminary routing of all connections, or can be an initial routing of a preselected subset of connections. Unrouted connections can be assigned estimated delays, so that (approximate) slacks may be computed. (Because step 502 is optional, it is shown in dashed lines.) At step 504, the initial routing is saved. At step 506, slack at each connection in the set is computed. At step 508, connections that are candidates for delay improvement are identified. At step 510, all signals that contain those candidates are unrouted. At step 512, load balancing is applied in rerouting those signals. At step 514, all connections of those signals are protected during rip-up and retry. The method then loops back to step 504, and the current routing is saved.

Figure 6:
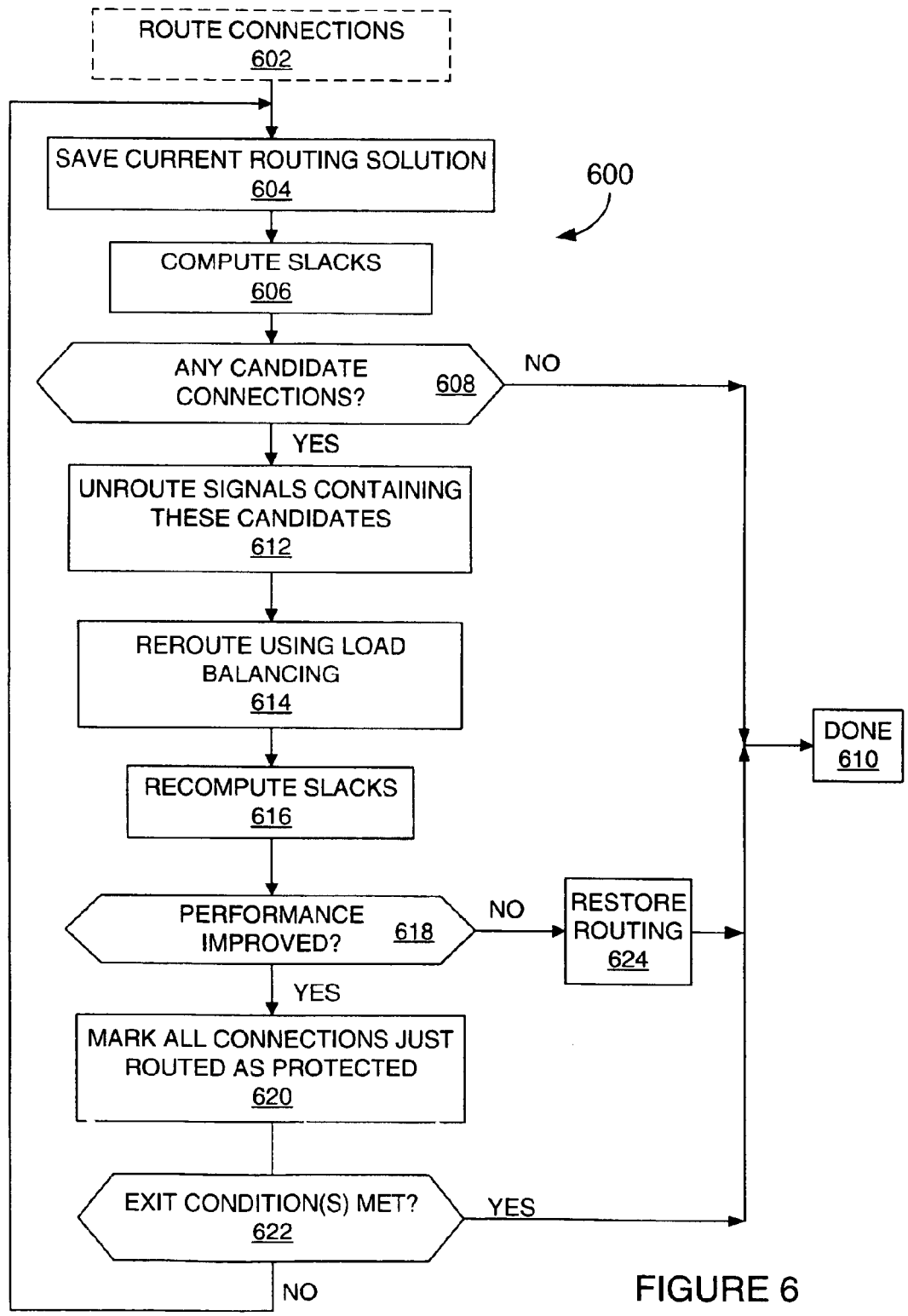
FIG. 6 is a flow chart of a method in accordance with a more specific embodiment of the invention.

FIG. 6 is a more detailed illustration of the method of FIG. 5. In method 600, a set of connections is (optionally) routed at step 602. Because step 602 is an optional step, it is shown in dashed lines. Step 602 can route all, some, or none of the connections. Any connection not routed is assigned an estimated delay. At step 604, the current routing is saved. At step 606, slack is computed. At step 608, the method checks whether there are any candidate connections.

If there are no candidate connections, the method is done. If there are candidates, at step 612, the method unroutes signals containing these candidates.

The method then proceeds to step 614, where signals are rerouted using load balancing. At step 616, slacks are recomputed. Then, at step 618, the method checks whether performance is improved. Performance improvement can be taken as an increase of the minimum slack, total slack, or some weighted average of the two. If yes (performance is improved), the method proceeds to step 620. Step 620 marks all connections just routed as protected during rip-up and retry. The method then proceeds to step 622, and checks whether one or more exit criteria are met. Many exit criteria are known to those in the art. Exit criteria can be one or more conditions. In one embodiment, an exit criterion can specify that the number of iterations be a predetermined maximum. Another embodiment specifies that the improvement be less than a predetermined threshold. In another embodiment, the two previous examples are combined, and the exit criterion is met if either the number of iterations is a predetermined maximum or the performance improvement is less than a predetermined threshold. If exit conditions are met (the response to step 622 is "yes"), the method proceeds to step 610, and is finished. If exit conditions are not met, the method then loops back to step 604 and the current routing is saved.

At step 618, if performance is not improved, the method does not go on to step 620. In one embodiment, at step 624, if performance has deteriorated, previously saved routing solutions are restored. The method then ends at step 610.

Figure 7:
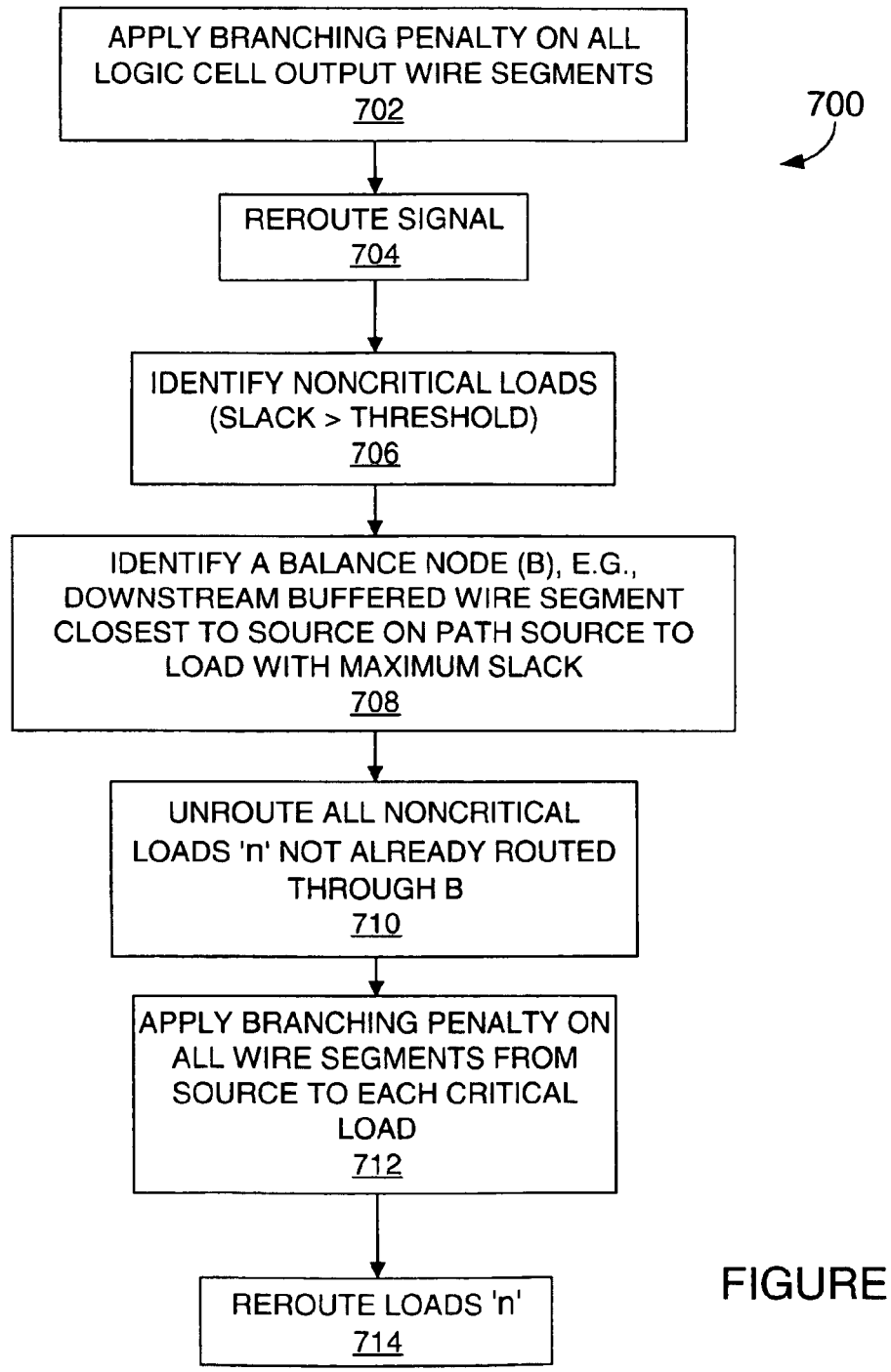
FIG. 7 is a flow chart illustrating the method of the load-balancing heuristic.

FIG. 7 illustrates the application of the load-balancing algorithm. In method 700, at step 702, a branching penalty is applied on all logic cell output wire segments. At step 704, the signal is rerouted. At step 706, non-critical loads are identified (a non-critical load is one in which slack is greater than a predetermined threshold value). At step 708, a balance node (B) is identified. The balance node can be, for example, the first buffered wire segment downstream from the large buffered wire segment on the route to the load with maximum slack.

At step 710, all non-critical loads (n) that are not already routed through balance node B are identified and are un-routed. At step 712, these loads "n" are encouraged to route through balance node B when they are rerouted. Finally, at step 714, the loads "n" are rerouted. This is achieved by applying a branching penalty on all wire segments from the source to each of the critical loads.

Other embodiments will be obvious to those skilled in the art in light of the above disclosure, including methods for determining delay limits useful for mask programmed devices and custom devices. Such embodiments are intended to fall within the scope of the present invention, which is limited only by the following claims.

What is claimed is:

1. A method for optimizing implementation of a logic design in a programmable logic device comprising:
    considering a first routing of the design in the programmable logic device;
    determining at least one critical path resulting from the first routing;
    selecting candidate connections not on the critical path;
    identifying a common buffer through which at least a portion of the candidate connections can be routed; and
    re-routing at least one of the candidate connections through the common buffer in order to reduce delay on the critical path.

2. The method of claim 1 wherein the step of considering a first routing comprises routing the design in the programmable logic device and saving routed connections.

3. The method of claim 1 further comprising:
    checking whether performance of the design has improved after re-routing the at least one of the candidate connections; and
    if the performance has not improved, restoring the at least one of the candidate connections; and
    if the performance has improved, protecting the rerouted connection from again being re-routed.

4. The method of claim 1 wherein the candidate connections are selected from a group of connections having positive slack.

5. The method of claim 4 wherein the step of re-routing includes making sure that the at least one of the candidate connections still has positive slack.

6. A method for laying out a logic design of elements, signals, and timing constraints, each signal comprising at least one connection from a source to a load, onto a device having logic blocks, wire segments, and means for connecting the wire segments to form routes, that comprises the steps of:
    routing a set of connections;
    saving the routed connections;
    computing slack at each connection in the design;
    identifying a subset of connections that are candidates for improvement;
    unrouting all signals containing a connection in the subset; and applying a load-balancing heuristic to reroute each signal that includes a connection in the subset.

7. The method of claim 6 further comprising:

recomputing the slack at each connection;

checking whether the performance has improved;

if the performance has not improved, restoring the previously saved routing solution and ending the method;

if the performance has improved, continuing with the following substeps:

marking all routed connections in the subset as protected during a rip-up and retry phase;

checking whether predetermined conditions for exit have occurred; and if the predetermined conditions have occurred, exiting the method, and otherwise looping back to the step of saving the routed connections.

8. The method of claim 7 wherein the predetermined conditions for exit include iterations having reached a preselected maximum.

9. The method of claim 7 wherein the predetermined conditions for exit include performance improvement being less than a preselected threshold.

10. The method of claim 6 wherein the step of applying a load-balancing heuristic comprises identifying at least one balance node downstream from the source that is driven by a buffer and routing a plurality of loads through the buffer.

11. The method of claim 10 wherein plural balance nodes are identified.

12. The method of claim 6 wherein the load-balancing heuristic for a signal includes the following steps:

applying a branching penalty on all logic cell output wire segments of the signal; and rerouting the signal.

13. The method of claim 6 in which the subset comprises all connections on paths with timing constraints.

14. The method of claim 6 in which the subset comprises only those connections with slack less than a preselected threshold.

15. The method of claim 14 in which the preselected threshold is zero.

16. The method of claim 6 in which at least one iteration combines delay-based routing of connections with resource-based routing of connections.

17. The method of claim 6 in which first delay-based routing is performed, and then unrouted connections are routed.

18. The method of claim 6 in which first resource-based routing is performed, and then delay-based routing is performed.

19. The method of claim 6 in which performance improvement is measured by an increase of a minimum of computed slacks.

20. The method of claim 6 in which performance improvement is measured by an increase of a sum of computed slacks.

21. The method of claim 6 in which performance improvement is measured by an increase of a weighted average of a minimum and a sum of computed slacks.

22. A load-balancing heuristic for routing a signal in a programmable logic device including the following steps:

identifying a balance node;

unrouting all loads of a signal with a slack greater than a prespecified threshold and not routed through the balance node;

applying a branching penalty on all wire segments from a source of the signal to all other loads of the signal; and rerouting the unrouted loads.

23. The method of claim 22 in which the step of identifying a balance node comprises the following substeps:

examining wire segments along a route from a source of the signal to a load of the signal with largest slack; and identifying a first buffered wire segment along the route past the source.

* * * * *